United States Patent
Jin et al.

(10) Patent No.: US 7,463,872 B2
(45) Date of Patent: Dec. 9, 2008

(54) METHODS AND APPARATUS FOR CONTROLLING A GAIN STATE OF A WIRELESS RECEIVER OPERATING IN AN IDLE MODE

(75) Inventors: Xin Jin, Ottawa (CA); Qingzhong Jiao, Nepean (CA); Tom Yun Sang Young, Ottawa (CA)

(73) Assignee: Research In Motion Limited, Waterloo, Ontario (CA)

( * ) Notice: Subject to any disclaimer, the term of this patent is extended or adjusted under 35 U.S.C. 154(b) by 640 days.

(21) Appl. No.: 11/065,406

(22) Filed: Feb. 24, 2005

(65) Prior Publication Data

US 2006/0189288 A1    Aug. 24, 2006

(51) Int. Cl.
*H04B 1/16* (2006.01)
*H04B 1/06* (2006.01)

(52) U.S. Cl. .................. 455/245.1; 455/234.2; 370/311

(58) Field of Classification Search .............. 455/232.1, 455/234.1, 234.2, 343.2, 235.1, 245.1; 375/345; 330/254, 278; 370/311
See application file for complete search history.

(56) References Cited

U.S. PATENT DOCUMENTS

| | | | |
|---|---|---|---|
| 6,356,538 B1 | 3/2002 | Li | |
| 6,445,730 B1 | 9/2002 | Greszczuk et al. | |
| 6,563,891 B1 * | 5/2003 | Eriksson et al. | 375/345 |
| 6,691,071 B2 * | 2/2004 | Kerr et al. | 702/188 |
| 6,871,055 B2 * | 3/2005 | Hirano et al. | 455/310 |
| 7,382,764 B2 * | 6/2008 | Uehara | 370/349 |
| 2003/0199258 A1 * | 10/2003 | Matsuki et al. | 455/136 |
| 2004/0043798 A1 * | 3/2004 | Amerga et al. | 455/574 |
| 2004/0259605 A1 * | 12/2004 | Quigley et al. | 455/574 |

OTHER PUBLICATIONS

European Search Report & Written Opinion for Application # 052251110.2, Sep. 15, 2005.

* cited by examiner

*Primary Examiner*—Christian A Hannon
(74) *Attorney, Agent, or Firm*—John J. Oskorep, Esq.

(57) ABSTRACT

The settling time of a wireless receiver is reduced by providing a previously utilized gain control state value to a low noise amplifier (LNA) of a receiver front end during a warm-up portion of a wake-up period of the wireless receiver which follows a sleep period. One illustrative method includes the steps of receiving a notification signal which indicates that the wireless receiver is to be placed in a sleep mode, reading a gain control state value from a gain controller based on receiving the notification signal, storing the gain control state value in memory, providing the stored gain control state value from the memory to the wireless receiver during a warm-up period of a second wake-up period following the first wake-up period, and providing a gain control state value from the gain controller to the wireless receiver based on a signal level of a currently received signal of the wireless receiver after the warm-up period.

25 Claims, 8 Drawing Sheets

US 7,463,872 B2

METHODS AND APPARATUS FOR CONTROLLING A GAIN STATE OF A WIRELESS RECEIVER OPERATING IN AN IDLE MODE

BACKGROUND

1. Field of the Technology

The present application relates generally to mobile stations operating in wireless communication networks, and more particularly to methods and apparatus for controlling the gain states of a wireless receiver operating in idle mode.

2. Description of the Related Art

A wireless communication device, such as a mobile station operating in a wireless communication network, may provide for both voice telephony and packet data communications. A mobile station may, for example, be compatible with $3^{rd}$ Generation (3G) communication standards (such as UMTS), or utilize Global System for Mobile Communications (GSM), Time Division Multiple Access (TDMA), or Code Division Multiple Access (CDMA) wireless network technologies.

All of these communication standards utilize radio frequency (RF) signal detection techniques implemented in a RF receiver. A RF receiver may generally face three performance limiting factors: internal thermal noise, external in-band noise, and out-of-band interference. When internal thermal noise is the predominate source of interference to the desired signal, a low receiver noise figure is desired to improve receiver sensitivity. External in-band interference (including external in-band noise) can also be the major source of interference; especially when the out-of-band portion of the interference does not cause significant distortion. In this case, a higher in-band dynamic range of the receiver is desired for good performance. The in-band dynamic range of the receiver is usually measured by the in-band $3^{rd}$ order interception point (i.e. "in-band IP3"). Finally, out-of-band interference may also result in distortions in the in-band spectrum through receiver non-linearities. In this case, a higher out-of-band dynamic range of the receiver is desired to improve performance. The out-of-band dynamic range is usually measured by the out-of-band $3^{rd}$ order interception point (i.e. "out-of-band IP3").

The aforementioned higher input dynamic range and lower noise figure may be contradictory requirements since higher input dynamic range means lower front end gain while lower noise figure suggests a higher front end gain design. A front end that is designed to satisfy both scenarios could be relatively expensive in cost. For a lower cost solution, some receiver designs include a variable front end stage. In particular, a low noise amplifier (LNA) in the front end may have an adjustable gain G, which is controlled by a feedback mechanism. In such a configuration, the gain G of the LNA can be adjusted dynamically in response to the feedback mechanism in order to trade off the noise figure with the dynamic range of the LNA when necessary.

To achieve the tradeoff, some feedback mechanisms include a level detector and a front end gain controller. The level detector receives an input signal and provides a signal level or received signal strength indicator (RSSI), and the front end gain controller receives this indicator to generate a control signal for controlling the front end gain.

In some configurations, the above feedback mechanism in a wireless receiver is used not only for continuous operation mode, but also for idle mode in a mobile station application. In idle mode, in order to save battery power, the receiver in a mobile station is turned off most of the time; it is periodically waken up at given time slots based on a predetermined schedule, such as every 1.28, 2.56 or 5.12 seconds, to receive message from base stations. A wake up period is usually very short in time, for example, about 100 ms in a CDMA2000™ mobile receiver. At the beginning of the wake up period, there is a warm-up period for settling the receiver to a steady state.

SUMMARY

An illustrative method for controlling a gain state of a wireless receiver operating in an idle mode comprises the steps of receiving, during a first wake-up period of the wireless receiver, a notification signal which indicates that the wireless receiver is to be placed in a sleep mode; reading a gain control state value from a gain controller based on receiving the notification signal; storing the gain control state value in memory; providing the stored gain control state value to the wireless receiver during a warm-up period of a second wake-up period following the first wake-up period; and after the warm-up period of the second wake-up period, providing a gain control state value from the gain controller to the wireless receiver based on a signal level of a currently received signal in the wireless receiver.

An illustrative mobile station of the present application comprises a receiver which receives radio frequency (RF) signals through an antenna, an amplifier of the receiver which is adapted to amplify the RF signals, a level detector which is adapted to detect a signal level of the RF signals, a gain controller which is adapted to provide a gain control state value in response to the signal level, and a processor which is adapted to read a gain control state value from the gain controller during a first wake-up period of the receiver, store the gain control state value in memory, provide a selection signal for selecting the stored gain control state value from the memory to the receiver during a warm-up period of a second wake-up period following the first wake-up period, and provide a gain control state value from the gain controller to the receiver based on a signal level of a currently received signal in the receiver.

BRIEF DESCRIPTION OF THE DRAWINGS

Embodiments of present invention will now be described by way of example with reference to attached figures, wherein.

DETAILED DESCRIPTION OF THE PREFERRED EMBODIMENTS

Figure 1:
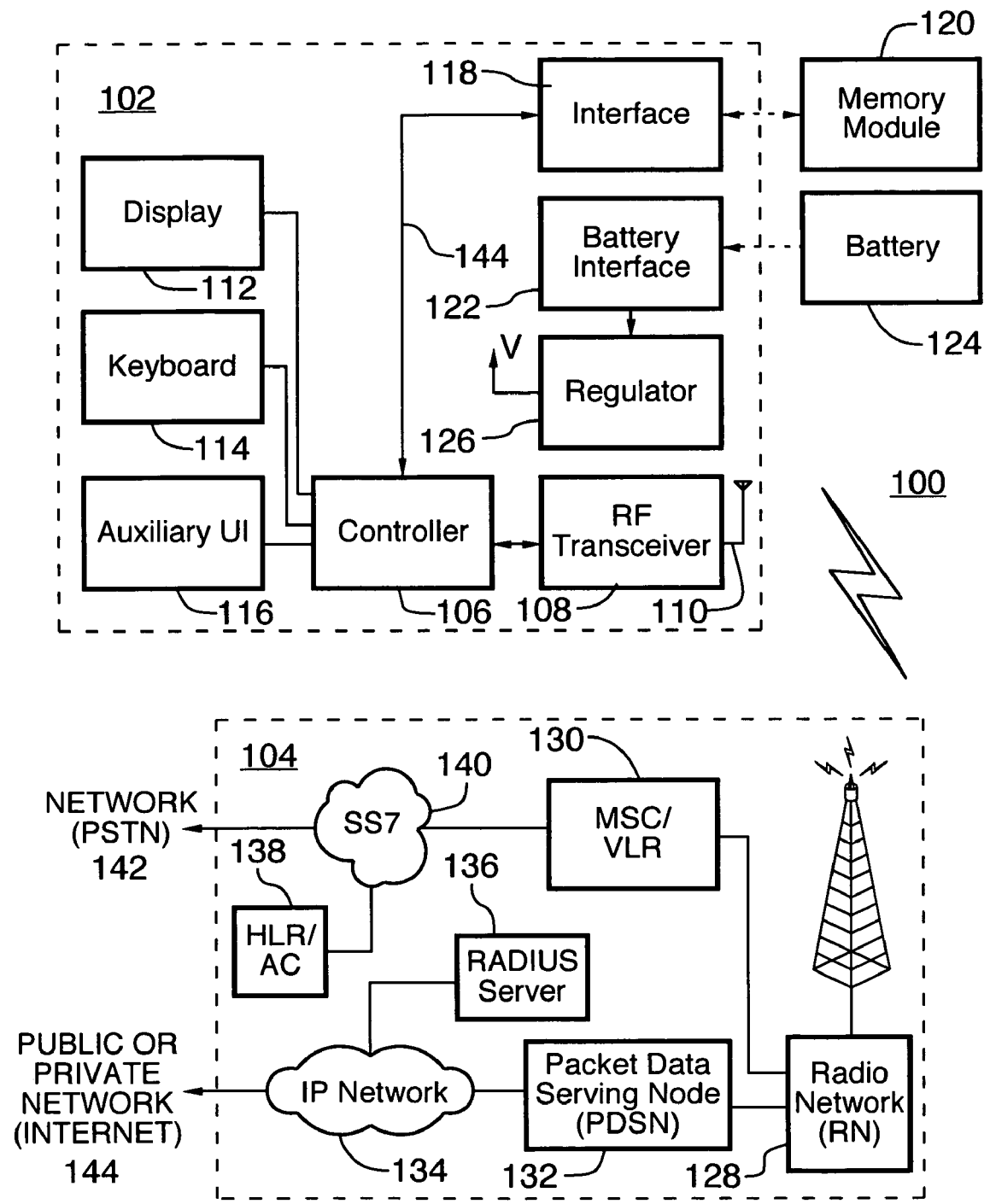
FIG. 1 is a block diagram that illustrates pertinent components of a mobile station and a wireless communication network.

Generally, the present application provides a method and apparatus for reducing the settling time of a wireless receiver's front end gain control loop. This is done by providing a previously-utilized gain control state value to a low noise amplifier (LNA) of the front end during a warm-up portion of a wake-up period of the receiver which follows a sleep period. At or near the end of each wake-up period, when a front end gain controller has been in steady state, a gain control state value of the front gain controller is read and stored in memory. During the next wake-up period, a processor retrieves the stored gain control state value from the memory and applies it to the LNA of the front end. Since the stored gain control state value was the previous optimal value at the end of the previous wake-up period, this value may still be optimal or near optimal for the new wake-up period. The LNA receives this gain control state value as a "best guessed" initial gain setting for the new wake-up period and, at such an optimal or near optimal gain condition, the rest of the circuitry settles relatively quickly. At the end of the warm-up period, when the front end gain controller reaches steady state, the processor returns control to the front end gain controller for the rest of the wake-up period to adjust the gain G of the LNA based on a signal level detected by a level detector from a currently received signal in the wireless receiver.

On one hand, the warm-up period at the beginning of the idle mode wake-up period in a radio frequency (RF) receiver and in a feedback mechanism which includes a level detector and a front end controller of the RF receiver should be sufficiently long (e.g. 20 milliseconds) to ensure that the receiver has enough time to reach an optimal receiving condition. On the other hand, the warm-up period should be as short as possible to conserve battery power. The front end gain controller reacts to both the desired input signal and interference, and settles at an optimal receiving state. Ideally, this optimal state produces a proper output signal to control the front end gain, resulting in an optimal tradeoff between dynamic range and noise figure for the current input signal condition. However, during the warm-up period and before the front end controller settles to its optimal receiving state, the front end gain controller may generate uncertain and possibly random states. Thus, the controlled LNA may not be optimized during the warm-up period. For example, when the LNA requires a high gain for optimal reception at a given input signal condition, the front end gain controller may erroneously be in a low gain state during the warm up period, which may cause a higher noise figure and may generate a higher thermal noise level. Similarly, when the LNA requires a low gain for optimal reception at a given condition, the front end gain controller may erroneously be in a high gain state, resulting in a lower IP3 and consequently higher intermodulation distortion (IMD).

Therefore, embodiments of a method and apparatus which control the front end gain state of a wireless receiver during wake-up periods in idle mode so as to minimize the settling time are provided herein.

FIG. 1 is a block diagram of a communication system 100, that includes a mobile station 102, which communicates through a wireless communication network 104. Mobile station 102 preferably includes a visual display 112, a keyboard 114, and perhaps one or more auxiliary user interfaces (UI) 116, each of which is coupled to a controller 106. Controller 106 is also coupled to radio frequency (RF) transceiver circuitry 108 and an antenna 110. Typically, controller 106 is embodied as a central processing unit (CPU), which runs operating system software in a memory component (not shown). Controller 106 will normally control overall operation of mobile station 102, whereas signal-processing operations associated with communication functions are typically performed in RF transceiver circuitry 108. Controller 106 interfaces with device display 112 to display received information, stored information, user inputs, and the like. Keyboard 114, which may be a telephone type keypad or full alphanumeric keyboard, is normally provided for entering data for storage in mobile station 102, information for transmission to network 104, a telephone number to place a telephone call, commands to be executed on mobile station 102, and possibly other or different user inputs.

Mobile station 102 sends communication signals to and receives communication signals from network 104 over a wireless link via antenna 110. RF transceiver circuitry 108 performs functions similar to those of a radio network (RN) 128, including for example modulation/demodulation and possibly encoding/decoding and encryption/decryption. It is also contemplated that RF transceiver circuitry 108 may perform certain functions in addition to those performed by RN 128. It will be apparent to those skilled in art that RF transceiver circuitry 108 will be adapted to particular wireless network or networks in which mobile station 102 is intended to operate.

Mobile station 102 includes a battery interface 122 for receiving one or more rechargeable batteries 124. Battery 124 provides electrical power to electrical circuitry in mobile station 102, and battery interface 122 provides for a mechanical and electrical connection for battery 124. Battery interface 122 is coupled to a regulator 126, which regulates power to the device, providing an output having a regulated voltage V. Mobile station 102 also operates using a memory module 120, such as a Subscriber Identity Module (SIM) or a Removable User Identity Module (R-UIM), which is connected to or inserted in mobile station 102 at an interface 118.

Mobile station 102 may consist of a single unit, such as a data communication device, a cellular telephone, a multiple-function communication device with data and voice communication capabilities, a personal digital assistant (PDA) enabled for wireless communication, or a computer incorporating an internal modem. Alternatively, mobile station 102 may be a multiple-module unit comprising a plurality of separate components, including but in no way limited to a computer or other device connected to a wireless modem. In particular, for example, in the mobile station block diagram of FIG. 1, RF transceiver circuitry 108 and antenna 110 may be implemented as a radio modem unit that may be inserted into a port on a laptop computer. In this case, the laptop computer would include display 112, keyboard 114, one or more auxiliary UIs 116, and controller 106 embodied as the computer's CPU. It is also, contemplated that a computer or other equipment not normally capable of wireless communication may be adapted to connect to and effectively assume control of RF transceiver circuitry 108 and antenna 110 of a single-unit device such as one of those described above. Such a mobile station 102 may have a more particular implementation as described later in relation to mobile station 202 of FIG. 2.

Mobile station 102 communicates in and through wireless communication network 104. In the embodiment of FIG. 1, wireless network 104 is a Third Generation (3G) supported network based on Code Division Multiple Access (CDMA) technologies. In particular, wireless network 104 is a cdma2000™ network which includes fixed network components coupled as shown in FIG. 1. Cdma2000™ is a trademark of the Telecommunications Industry Association (TIA). Wireless network 104 of the cdma2000-type includes a Radio Network (RN) 128, a Mobile Switching Center (MSC) 130, a Signaling System 7 (SS7) network 140, a Home Location Register/Authentication Center (HLR/AC) 138, a Packet Data Serving Node (PDSN) 132, an IP network 134, and a Remote Authentication Dial-In User Service (RADIUS) server 136. SS7 network 140 is communicatively coupled to a network 142 (such as a Public Switched Telephone Network or PSTN), whereas IP network is communicatively coupled to a network 144 (such as the Internet).

During operation, mobile station 102 communicates with RN 128, which performs functions such as call-setup, call processing, and mobility management. RN 128 includes a plurality of base station transceiver systems that provide wireless network coverage for a particular coverage area commonly referred to as a "cell". A given base station transceiver system of RN 128, such as the one shown in FIG. 1, transmits communication signals to and receives communication signals from mobile stations within its cell. The base station transceiver system normally performs such functions as modulation and possibly encoding and/or encryption of signals to be transmitted to the mobile station in accordance with particular, usually predetermined, communication protocols and parameters, under control of its controller. The base station transceiver system similarly demodulates and possibly decodes and decrypts, if necessary, any communication signals received from mobile station 102 within its cell. Communication protocols and parameters may vary between different networks. For example, one network may employ a different modulation scheme and operate at different frequencies than other networks. The underlying services may also differ based on its particular protocol revision.

The wireless link shown in communication system 100 of FIG. 1 represents one or more different channels, typically different radio frequency (RF) channels, and associated protocols used between wireless network 104 and mobile station 102. An RF channel is a limited resource that must be conserved, typically due to limits in overall bandwidth and a limited battery power of mobile station 102. Those skilled in art will appreciate that a wireless network in actual practice may include hundreds of cells depending upon desired overall expanse of network coverage. All pertinent components may be connected by multiple switches and routers (not shown), controlled by multiple network controllers.

For all mobile station's 102 registered with a network operator, permanent data (such as mobile station 102 user's profile) as well as temporary data (such as mobile station's 102 current location) are stored in a HLR/AC 138. In case of a voice call to mobile station 102, HLR/AC 138 is queried to determine the current location of mobile station 102. A Visitor Location Register (VLR) of MSC 130 is responsible for a group of location areas and stores the data of those mobile stations that are currently in its area of responsibility. This includes parts of the permanent mobile station data that have been transmitted from HLR/AC 138 to the VLR for faster access. However, the VLR of MSC 130 may also assign and store local data, such as temporary identifications. HLR/AC 138 also authenticates mobile station 102 on system access.

In order to provide packet data services to mobile station 102 in a cdma2000-based network, RN 128 communicates with PDSN 132. PDSN 132 provides access to the Internet 144 (or intranets, Wireless Application Protocol (WAP) servers, etc.) through IP network 134. PDSN 132 also provides foreign agent (FA) functionality in mobile IP networks as well as packet transport for virtual private networking. PDSN 132 has a range of IP addresses and performs IP address management, session maintenance, and optional caching. RADIUS server 136 is responsible for performing functions related to authentication, authorization, and accounting (AAA) of packet data services, and may be referred to as an AAA server.

Those skilled in the art will appreciate that wireless network 104 may be connected to other systems, possibly including other networks, not explicitly shown in FIG. 1. A network will normally be transmitting at very least some sort of paging and system information on an ongoing basis, even if there is no actual packet data exchanged. Although the network consists of many parts, these parts all work together to result in certain behaviours at the wireless link.

Figure 2:
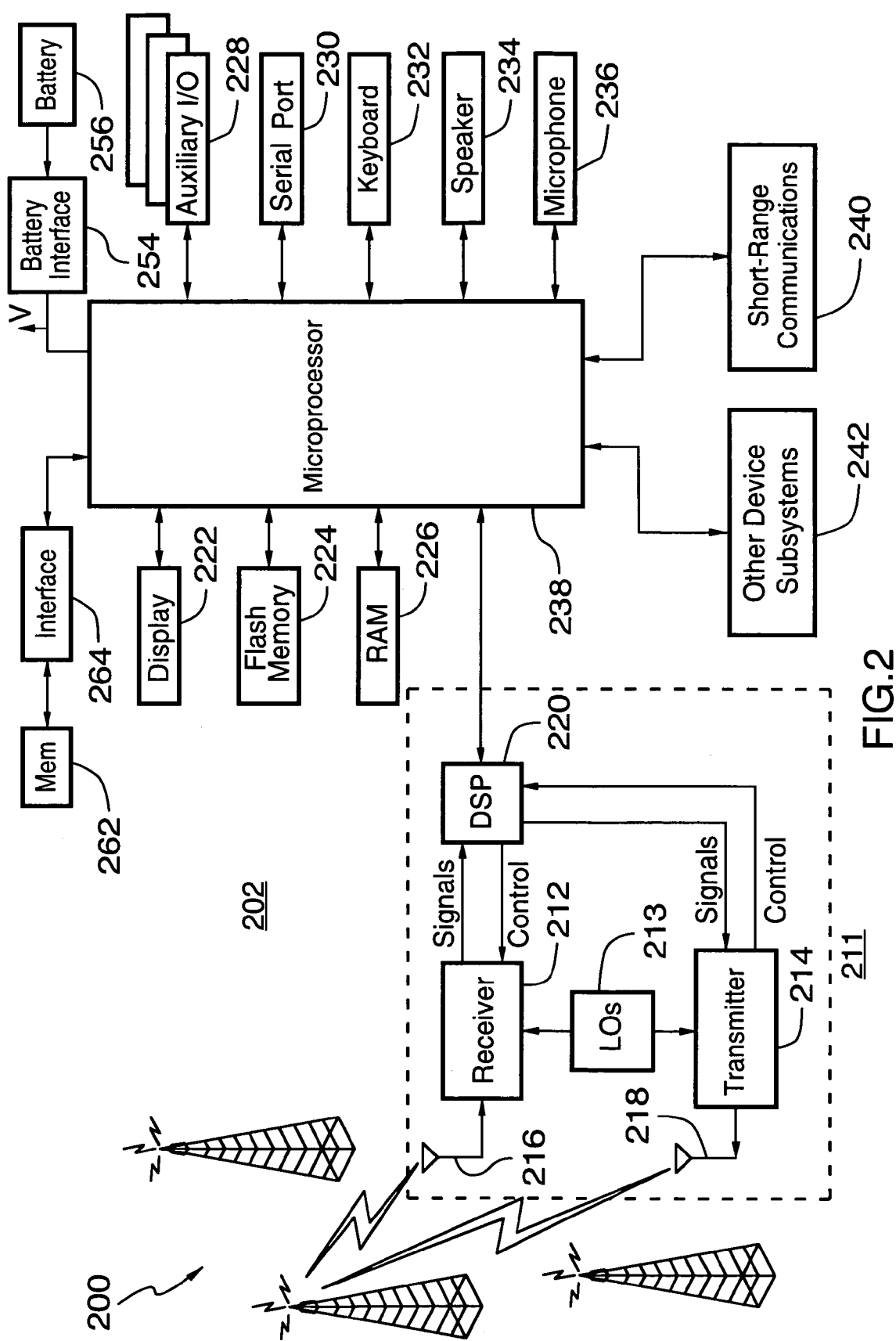
FIG. 2 is a more detailed diagram of a preferred mobile station of FIG. 1.

FIG. 2 is a detailed block diagram of a preferred mobile station 202 utilized in the present application. Mobile station 202 is preferably a two-way communication device having at least voice and advanced data communication capabilities, including the capability to communicate with other computer systems. Depending on the functionality provided by mobile station 202, it may be referred to as a data messaging device, a two-way pager, a cellular telephone with data messaging capabilities, a wireless Internet appliance, or a data communication device (with or without telephony capabilities). Mobile station 202 may communicate with any one of a plurality of base station transceiver systems 200 within its geographic coverage area.

Mobile station 202 will normally incorporate a communication subsystem 211, which includes a receiver 212, a transmitter 214, and associated components, such as one or more (preferably embedded or internal) antenna elements 216 and 218, local oscillators (LOs) 213, and a processing module such as a digital signal processor (DSP) 220. Communication subsystem 211 is analogous to RF transceiver circuitry 108 and antenna 110 shown in FIG. 1. As will be apparent to those skilled in field of communications, particular design of communication subsystem 211 depends on the communication network in which mobile station 202 is intended to operate.

Mobile station 202 may send and receive communication signals over the network after required network registration or activation procedures have been completed. Signals received by antenna 216 through the network are input to receiver 212, which may perform such common receiver functions as signal amplification, frequency down conversion, filtering, channel selection, and, analog-to-digital (A/D) conversion. A/D conversion of a received signal allows more complex communication functions such as demodulation and decoding to be performed in DSP 220. In a similar manner, signals to be transmitted are processed, including modulation and encoding, for example, by DSP 220. These DSP-processed signals are input to transmitter 214 for digital-to-analog (D/A) conversion, frequency up conversion, filtering, amplification and transmission over communication network via antenna 218. DSP 220 not only processes communication signals, but also provides for receiver and transmitter control. For example, the gains applied to communication signals in receiver 212 and transmitter 214 may be adaptively controlled through automatic gain control algorithms implemented in DSP 220.

Network access is associated with a subscriber or user of mobile station 202, and therefore mobile station 202 requires a memory module 262, such as a Subscriber Identity Module or "SIM" card or a Removable User Identity Module (R-UIM), to be inserted in or connected to an interface 264 of mobile station 202 in order to operate in the network. Since mobile station 202 is a mobile battery-powered device, it also includes a battery interface 254 for receiving one or more rechargeable batteries 256. Such a battery 256 provides electrical power to most if not all electrical circuitry in mobile station 202, and battery interface 254 provides for a mechanical and electrical connection for it. Battery interface 254 is coupled to a regulator (not shown) which regulates power to all of the circuitry, providing an output having a regulated voltage V.

Microprocessor 238, which is one implementation of controller 106 of FIG. 1, controls overall operation of mobile station 202. This control includes network selection techniques of the present application. Communication functions, including at least data and voice communications, are performed through communication subsystem 211. Microprocessor 238 also interacts with additional device subsystems such as a display 222, a flash memory 224, a random access memory (RAM) 226, auxiliary input/output (I/O) subsystems 228, a serial port 230, a keyboard 232, a speaker 234, a microphone 236, a short-range communications subsystem 240, and any other device subsystems generally designated at 242. Some of the subsystems shown in FIG. 2 perform communication-related functions, whereas other subsystems may provide "resident" or on-device functions. Notably, some subsystems, such as keyboard 232 and display 222, for example, may be used for both communication-related functions, such as entering a text message for transmission over a communication network, and device-resident functions such as a calculator or task list. Operating system software used by microprocessor 238 is preferably stored in a persistent store such as flash memory 224, which may alternatively be a read-only memory (ROM) or similar storage element (not shown). Those skilled in the art will appreciate that the operating system, specific device applications, or parts thereof, may be temporarily loaded into a volatile store such as RAM 226.

Microprocessor 238, in addition to its operating system functions, preferably enables execution of software applications on mobile station 202. A predetermined set of applications, which control basic device operations, including at least data and voice communication applications, will normally be installed on mobile station 202 during its manufacture. A preferred application that may be loaded onto mobile station 202 may be a personal information manager (PIM) application having the ability to organize and manage data items relating to user such as, but not limited to, e-mail, calendar events, voice mails, appointments, and task items. Naturally, one or more memory stores are available on mobile station 202 and SIM 256 to facilitate storage of PIM data items and other information.

The PIM application preferably has the ability to send and receive data items via the wireless network. In a preferred embodiment, PIM data items are seamlessly integrated, synchronized, and updated via the wireless network, with the mobile station user's corresponding data items stored and/or associated with a host computer system thereby creating a mirrored host computer on mobile station 202 with respect to such items. This is especially advantageous where the host computer system is the mobile station user's office computer system. Additional applications may also be loaded onto mobile station 202 through network, an auxiliary I/O subsystem 228, serial port 230, short-range communications subsystem 240, or any other suitable subsystem 242, and installed by a user in RAM 226 or preferably a non-volatile store (not shown) for execution by microprocessor 238. Such flexibility in application installation increases the functionality of mobile station 202 and may provide enhanced on-device functions, communication-related functions, or both. For example, secure communication applications may enable electronic commerce functions and other such financial transactions to be performed using mobile station 202.

In a data communication mode, a received signal such as a text message, an e-mail message, or web page download will be processed by communication subsystem 211 and input to microprocessor 238. Microprocessor 238 will preferably further process the signal for output to display 222 or alternatively to auxiliary I/O device 228. A user of mobile station 202 may also compose data items, such as e-mail messages, for example, using keyboard 232 in conjunction with display 222 and possibly auxiliary I/O device 228. Keyboard 232 is preferably a complete alphanumeric keyboard and/or telephone-type keypad. These composed items may be transmitted over a communication network through communication subsystem 211.

For voice communications, the overall operation of mobile station 202 is substantially similar, except that the received signals would be output to speaker 234 and signals for transmission would be generated by microphone 236. Alternative voice or audio I/O subsystems, such as a voice message recording subsystem, may also be implemented on mobile station 202. Although voice or audio signal output is preferably accomplished primarily through speaker 234, display 222 may also be used to provide an indication of the identity of a calling party, period of a voice call, or other voice call related information, as some examples.

Serial port 230 in FIG. 2 is normally implemented in a personal digital assistant (PDA)-type communication device for which synchronization with a user's desktop computer is a desirable, albeit optional, component. Serial port 230 enables a user to set preferences through an external device or software application and extends the capabilities of mobile station 202 by providing for information or software downloads to mobile station 202 other than through a wireless communication network. The alternate download path may, for example, be used to load an encryption key onto mobile station 202 through a direct and thus reliable and trusted connection to thereby provide secure device communication.

Short-range communications subsystem 240 of FIG. 2 is an additional optional component, which provides for communication between mobile station 202 and different systems or devices, which need not necessarily be similar devices. For example, subsystem 240 may include an infrared device and associated circuits and components, or a Bluetooth™ communication module to provide for communication with similarly enabled systems and devices. Bluetooth™ is a registered trademark of Bluetooth SIG, Inc.

Figure 3:
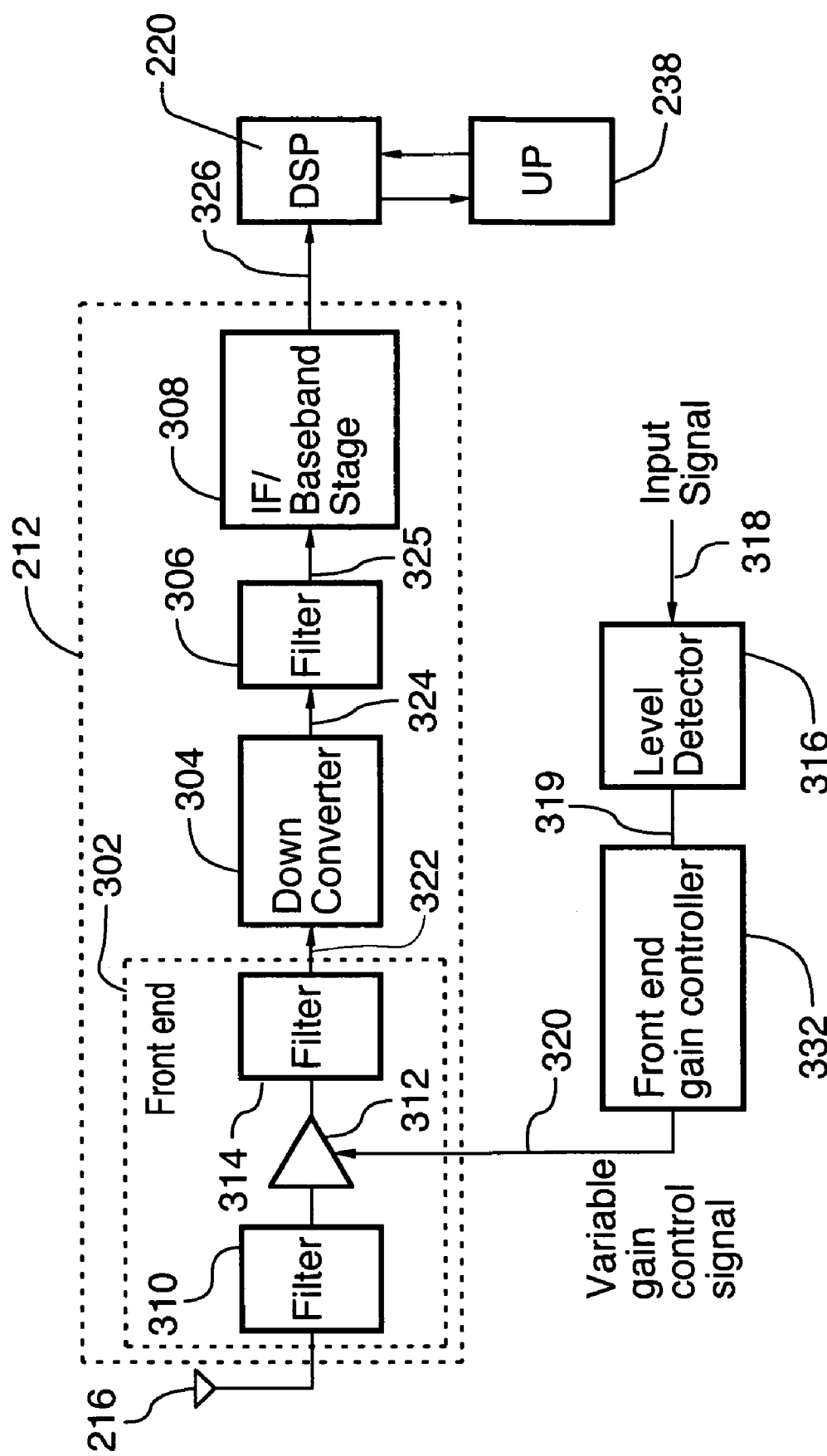
FIG. 3 is a block diagram illustrating in further detail components of the mobile station of FIG. 1 used for controlling front end gain.

FIG. 3 is a block diagram illustrating in further detail receiver components of receiver 212. Receiver components of receiver 212 of FIG. 3 include a front end stage 302, a down converter 304, a filter 306, and an intermediate frequency (IF) and/or baseband stage 308. Front end stage 302 typically includes a filter 310, a low noise amplifier (LNA) 312, and a filter 314. Filter 310 of front end stage 302 has an input coupled to antenna 216 and an output coupled to an input of LNA 312. LNA 312 has an output coupled to an input of filter 314, which has an output 322 coupled to an input of down converter 304. Down converter 304 has an output 324 coupled to an input of filter 306. An output 325 of filter 306 is coupled to an input of IF/baseband stage 308, which has an output 326 coupled to DSP 220.

In front end stage 302, filters 310 and 314 are bandpass filters typically using Surface Acoustic Wave (SAW) filter technology. The function of down converter 304 is to mix the RF signals received through front end stage 302 with a local oscillator (LO) in down converter 304, to thereby produce IF signals (or baseband signals if zero IF technology is utilized). The function of IF/baseband stage 308 is to convert the IF signals into baseband signals (unless zero IF technology is utilized) and to process and/or filter the baseband signals. The IF/baseband stage 308 usually also provides automatic gain control (AGC) functionality, which adjusts the gain of the IF/baseband stage 308 to ensure the total signal, interference, noise and distortion level seen at signal 326 remains unchanged, regardless of changes in input signal and interference levels, and how the front end gain 312 changes which will be further discussed hereinafter. Filter 306 may be part of IF/baseband 308. When IF is used, filter 306 is typically a bandpass filter; when zero IF is used, filter 306 is typically a low pass filter. When IF is used, it is possible that filter 306 is implemented in multiple stages; for example, a bandpass filter in the IF stage and a lowpass filter at the baseband stage. DSP 220 operates to process the baseband signals, for example, to correlate the baseband signals with a predetermined signal under control of microprocessor 238.

Figure 4:
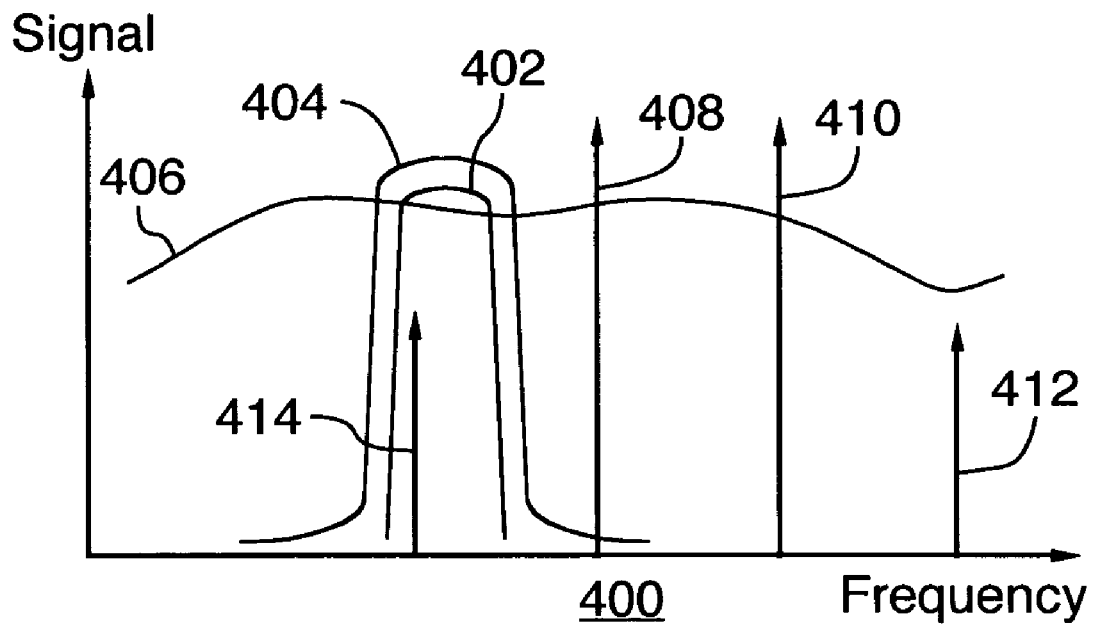
FIG. 4 is a graph of signals in a frequency domain before applying the known technique of noise reduction by filtering.
Figure 5:
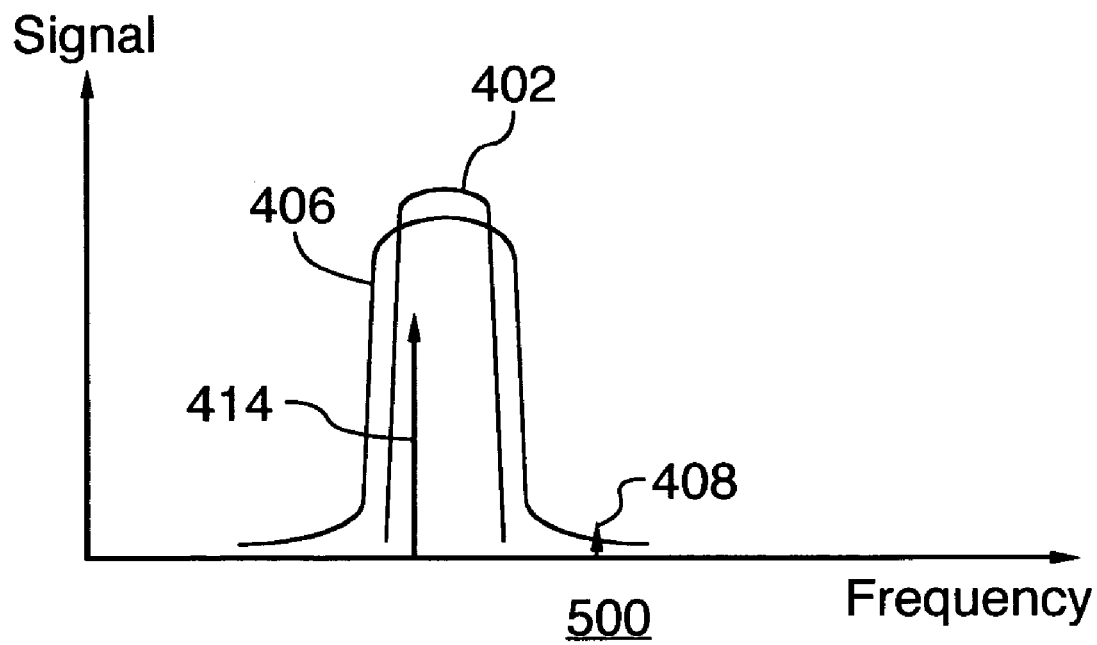
FIG. 5 is a graph of signals in the frequency domain after applying the known technique of noise reduction by filtering.

FIG. 4 is a graph 400 showing curves in the frequency domain at output 322 and/or output 324 in transceiver 212 (although outputs 322 and 324 are associated with different frequency ranges). In graph 400, a curve 402 depicts the desired received signal, a curve 406 depicts internal noise as well as external interference, curves 408 and 410 depict strong narrow out-of-band interference, and curves 412 and 414 depict intermodulation distortion produced in front end stage 302 due to undesirable non-linearity. A curve 404 depicts the shape of a response of filter 306 that follows, which is intended to remove the out-of-band interference and distortion. FIG. 5 is a graph 500 of curves in the frequency domain at output 325 and/or output 326 in receiver 212 (although outputs 325 and 326 may be associated with different frequency ranges). Note that curve 406 of FIG. 5 depicting the internal noise and external interference after filtering becomes shaped similarly to filter's 306 response (i.e. curve 404 of FIG. 4). As illustrated, the out-of-band contents (by comparing curve 406 of FIG. 4) are greatly reduced. Out-of-band interferences and intermodulation distortion (i.e. curves 408 and 410 as well as 412 of FIG. 4) are also greatly reduced. Intermodulation distortion (i.e. curve 414) may still exist.

In order to improve processing due to the trade-off in noise figure and dynamic range requirements, some receiver designs include a variable front end stage. In particular, referring back to FIG. 3, LNA 312 has an adjustable gain G which is controlled by a variable gain control signal 320 from a feedback mechanism. In general, the gain G of LNA 312 is adjusted dynamically in response to the feedback mechanism in order to trade off the noise figure with the dynamic range of LNA 312 when necessary. LNA 312 has an inherent limited dynamic range due to its imperfect linearity.

In general, variable gain control signal 320 is produced by a front end gain controller 332 based on an output of level detector 316 which is input to LNA 312 for controlling the gain G. Level detector 316 operates to detect an overall level of an input signal 318 which is the total desired signal plus interference and distortion. Front end gain controller 332 maps the output 319 of level detector 316 to the variable gain control signal 320. During operation, level detector 316 continually monitors the total desired signal plus interference and distortion. When the signal level is high, for example, the frond end gain controller causes the variable gain control signal 320 to reduce the adjustable gain G to LNA 312. The reason is that, in this situation, receiver 212 requires a higher dynamic range since the noise figure is less important.

Level detector 316 receives input signal 318 from one of a few different sources, depending on which prior art technique is utilized. One source is from output 322 of front end stage 302, another source is from output 324 of down converter 304, and yet another source is from output 326 where level detector 316 is included in the signal processing of DSP 220.

Figure 6:
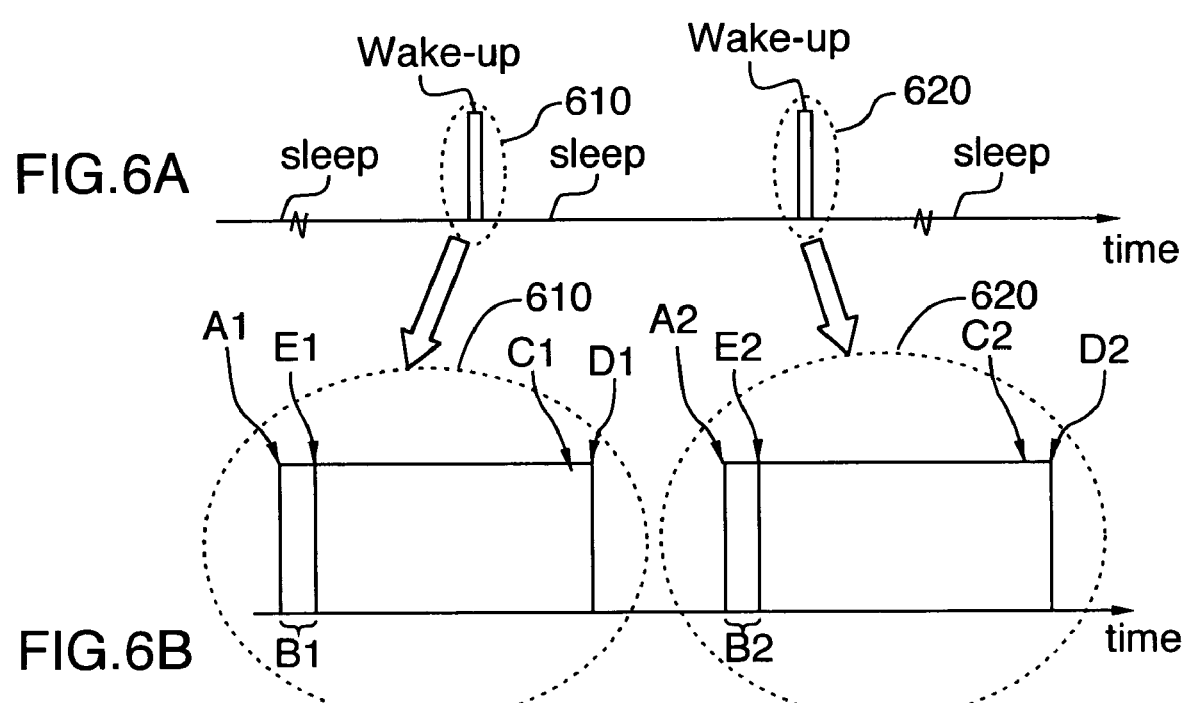
FIG. 6A is a graph of sleep and wake-up activities over time in idle mode of a wireless receiver.
FIG. 6B is an enlarged graph of the sleep and wake-up activities over time in the wireless receiver from FIG. 6A.

FIG. 6A shows sleep and wake-up activities over time during idle mode operation, where a high value indicates that the receiver is in a wake-up period and a low value indicates that the receiver is in a sleep period. The receiver may be receiver 212 of FIG. 3, utilized in the devices of FIGS. 1-2. In idle mode, receiver 212 sleeps and wakes up repeatedly. Receiver 212 is placed in a sleep mode (i.e. a low power mode such as being turned off) where it does not receive signals, but does receives signals when it wakes up. Waveform 610 shows a first wake-up period where receiver 212 wakes up to receive signals. Waveform 620 shows a second wake-up period following after the first wake-up period.

FIG. 6B shows magnified views of two consecutive wake-up periods 610 and 620 from FIG. 6A during idle mode operation of the receiver. As shown by periods 610 and 620, a time instant A1 and a time instant A2 are the start of wake-up period 610 and the start of wake-up period 620, respectively. At these time instants, receiver 212 is turned on and begins to "warm-up". Period B1 and period B2 are warm-up periods, which are the actual or maximum time periods it takes for the circuitry to settle into steady state. A time instant E1 and a time instant E2 are the end of warm-up period B1 and the end of warm-up period B2, respectively. A time instant D1 and a time instant D2 are the end of wake-up period 610 and the end of wake-up period 620, respectively. A time instant C1 and a time instant C2 are time points prior to the ends of the wake-up periods, respectively, and most preferably are the time points immediately before the ends of the wake-up periods. During the warm-up periods B1 and B2, receiver 212 has not settled into a steady state mode of operation, and the front end gain state is uncertain and may in fact be random.

Figure 7:
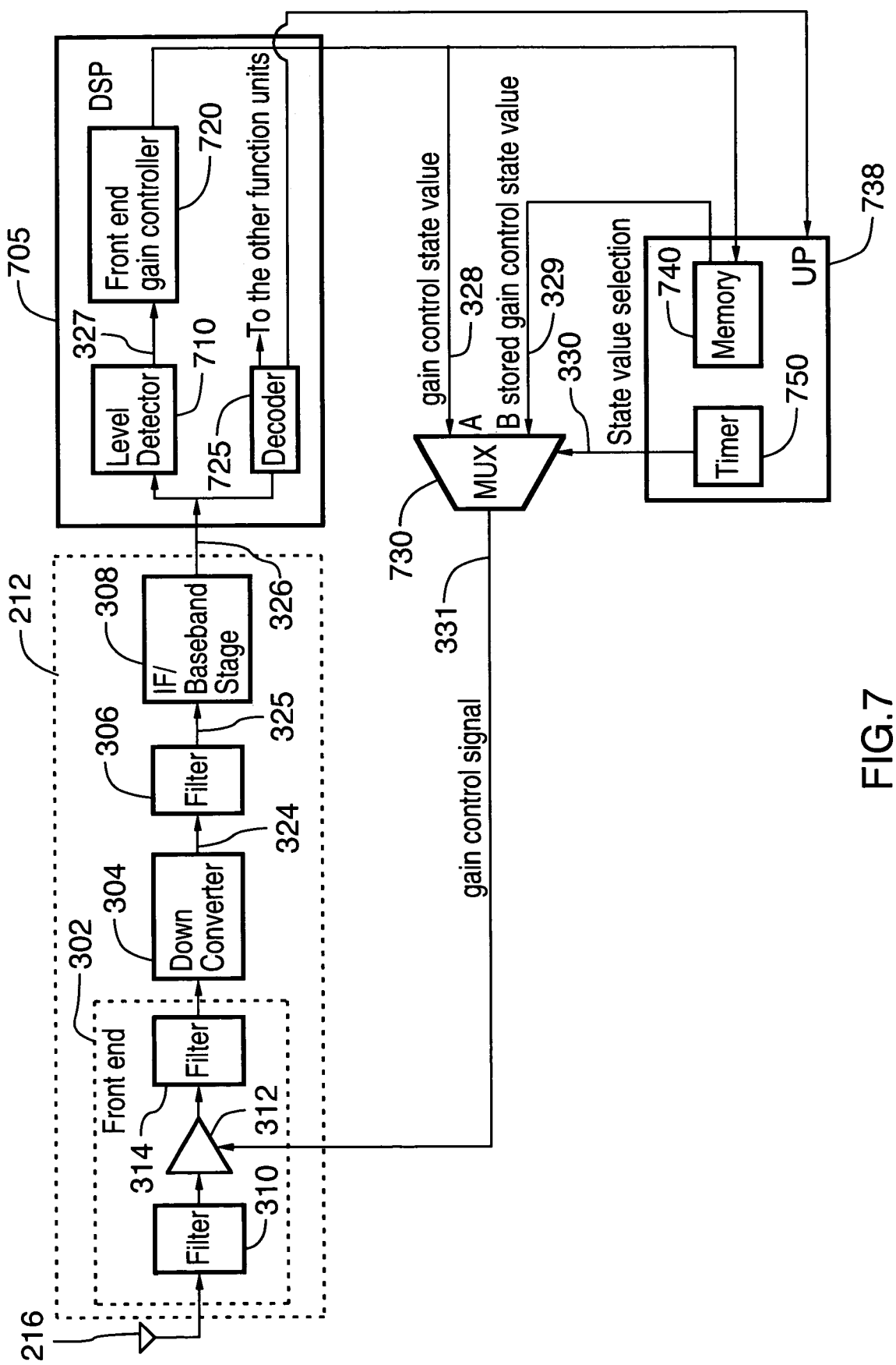
FIG. 7 shows an embodiment of apparatus for controlling gain state of the wireless receiver operating in an idle mode to reduce settling time during a warm-up period of the receiver.

FIG. 7 shows an embodiment of the apparatus for controlling a gain state of a wireless receiver in an idle mode to reduce settling time during warm-up periods according to the present application. As shown in FIG. 7, receiver 212 is similar to that of FIG. 3 but includes additional components and techniques. The apparatus as shown further includes a level detector 710, a front end gain controller 720, a decoder 725, a multiplexer 730, memory 740, and a timer 750. Level detector 710 and front end gain controller 720 may be incorporated in DSP 705 or implemented separately if desired. Similarly, memory 740 and timer 750 may be incorporated in microprocessor 738 or implemented separately if desired.

Level detector 710 receives an input signal 326 from receiver 212 to detect a mean power level of the input signal and produces an input signal mean power level indicator signal or RSSI 327 to front end gain controller 720. During warm-up periods B1 and B2 of FIG. 6b, front end gain controller 720 has not settled into steady state and an uncertain or random signal 328 may be produced. Thus, if signal 328 is used to control LNA 312 directly during the warm-up period, LNA 312 may not be adjusted to a proper gain during this period of time. Instead of using signal 328 during the warm-up period, however, a multiplexer 730 is selected by microprocessor 738 to provide a better initial value 329 from memory 740 and made available at port B. The generation of this initial value 329 and the control method will be described in further detail in the following paragraph. Subsequently, during a period from instant E1 to instant D1 or from instant E2 to D2 (FIG. 6B) (wake-up periods), front end gain controller 720 has settled to steady state and therefore signal 328 can be used to properly control LNA 312 during this time.

Once decoding operation of decoder 725 has finished during a wake-up period, decoder 725 provides a notification signal to microprocessor 738 which indicates decoding has finished. Receiver 212 is ready to be placed in a sleep mode of operation where it may be placed in a low power state or powered down. At instant C1 immediately before instant D1 which marks the end of the first wake-up period 610 (FIG. 6B), microprocessor 738 reads a gain control state value from front end gain controller 720 and stores it into memory 740. Memory 740 may be implemented as random access memory (RAM), for example. When receiver 212 is in the next wake-up period 620, during the warm-up period B2 (FIG. 6B), microprocessor 738 sets the state value selection signal 330 to inhibit the input terminal A of multiplexer 730 and provide the input terminal B of multiplexer 730 at the MUX 730 output, to thereby provide the gain control state value 329 to the gain control terminal of LNA 312. The same method may be used repeatedly for each and every wake-up period, except the very first wake-up after the mobile station is powered up which will be addressed hereinafter. By this method, the gain G of LNA 312 is adjusted to a statistically-appropriate initial state value during warm-up periods, in accordance with the gain control state value that was optimal a short time period beforehand at the end of previous wake-up period.

When receiver 212, level detector 710, and front end gain controller 720 operate in steady state (such as from instant E2 to instant D2 of FIG. 6B), front end gain controller 720 receives a mean power level (RSSI) signal 327 and provides a gain control state value 328. This gain control state value may be one selected from that depicted in FIG. 8A. Timer 750 of the apparatus is set to time a period from the end of the first wake-up period 610 to the beginning of the second wake-up period 620. Timer 750 is also set at the beginning of the wake-up slot (such as A2) and expires after a period that is equal to the warm-up period (such as B2, at a time instant such as E2). At this time, timer 750 triggers the microprocessor 738 to set the state value selection signal 330 to provide the input terminal A of multiplexer 730 and not the input terminal B of multiplexer 730 at its output. The gain control state value 328 is sent to LNA 312 from front end gain controller 720. The gain G of LNA 312 is adjusted according to the gain control state value, which is optimal by design and based on the signal level of the currently received signal.

Thus, the described method relies on a "settled" gain state value from the previous wake-up period. In the very first wake-up period after the mobile station is powered up, however, there is no recent settled value to use and therefore an optimal initial guess is not available. The receiver may have to suffer a possibly longer settling time for this first wake-up period. However, this does not degrade performance significantly because when the receiver is powered up, the mobile station is in its system determination state during which it is searching for an available wireless network. This process takes much longer than a slotted mode wake-up period, thus the longer settling time caused by the imperfect initial estimate has little impact on performance during this time. Two options can be used for the very first wake-up period: one is to use the signal 328 directly to control LNA 312 by selecting port A at multiplexer 330; and the other is to use the initial state value that is stored in memory 740 (e.g. either a predetermined default state value or a state value obtained during previous wake-up period before last power down).

In designing a variable gain receiver front end for trading off between noise figure and dynamic range, there are three options: (1) an N-step variable gain, such as a two-step gain design with a high gain and a low gain; a three-step gain design with a high gain, a medium gain, and a low gain; an N-step gain design with a plurality of gain state values, etc.; (2) a continuously variable gain that can set the gain in a continuous range; and (3) a combination of step gain and a continuously variable gain. Accordingly, the front gain controller 720 needs to provide the corresponding control signal 328.

Figure 8A:
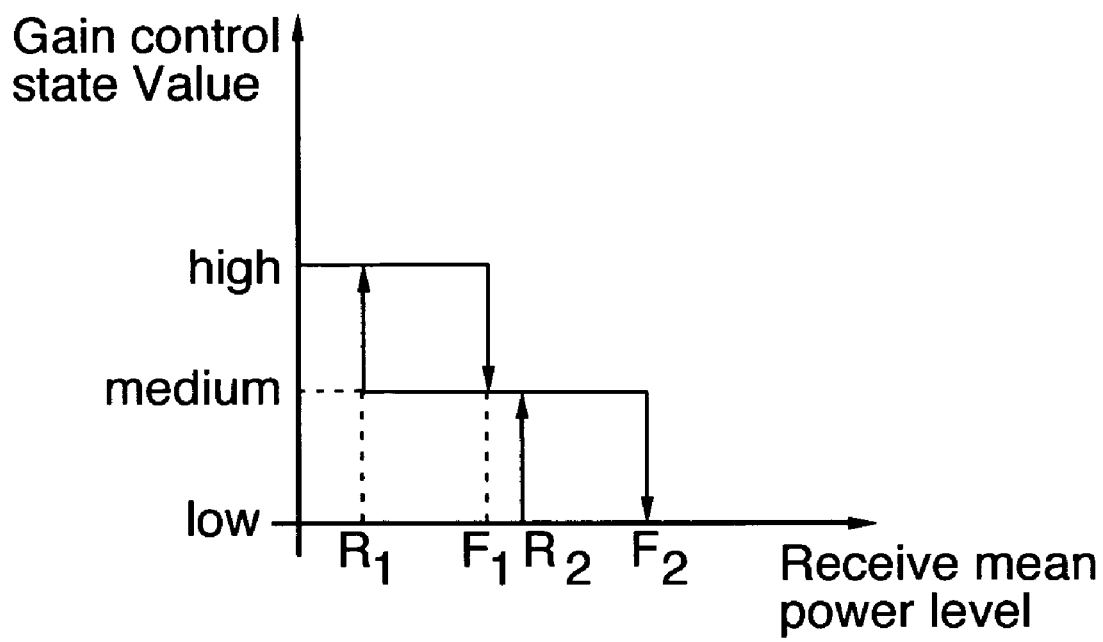
FIG. 8A shows a step gain control signal as a function of the received mean power level after the warm-up period.

In a first embodiment of the present application, the receiver uses step gain control; the control characteristics of front end gain controller 720 is shown in FIG. 8A, which utilizes a three-step gain control as an embodiment. When the receive mean power level or RSSI is less than R1, the receive signal is weak and thus LNA 312 requires a high gain. Therefore, front end gain controller 720 provides a high gain control state value for LNA 312. When the receive mean power level or RSSI is above F1 and below R2, front end gain controller 720 provides a medium gain control state value to LNA 312 so that the gain G of LNA 312 is adjusted to a medium gain. When the receive mean power level or RSSI is between R1 and F1, LNA 312 can provide good performance either at high gain or medium gain, the controller determines the output state according to a hysteresis rule based on the history of the gain state applied to LNA 312. The hysteresis rule may follow the following logic: if the gain state was high, it continues to stay high; if the gain was medium, it continues to stay medium; etc. The hysteresis rule prevents the gain state jumps back and forth too quickly and frequently when received signal strength varies around the thresholds. When the receive mean power level or amplitude is above F2, the signal is strong; therefore front end gain controller 720 provides a low gain control signal to LNA 312 so that LNA 312 is at low gain. The low gain may be implemented by bypassing some or all stages of the LNA. When the receive mean power level or RSSI is between R2 and F2, the LNA 312 can provide good performance either at medium gain or low gain, the controller determines the output state using the hysteresis rule: if the gain state was medium, it continues to stay medium; if the gain was low, it continues to stay low.

With respect to the "two-step" gain design having a high gain and a low gain, the gain state is a high gain control state value while the receive mean power level is less than a first threshold RI; the gain state is a low gain control state value while the receive mean power level is more than a second threshold F1; and the gain state is subject to the hysteresis rule between a high gain control state value and a low gain control state value while the receive mean power level is between R1 and F1.

Figure 8B:
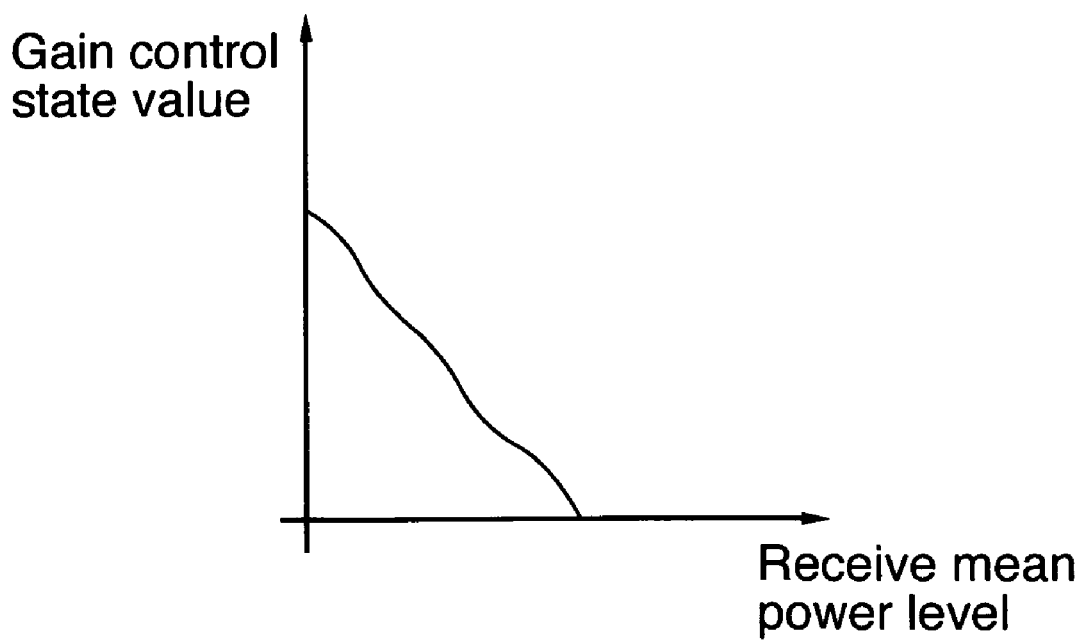
FIG. 8B shows a continuous gain control signal as a function of the received mean power level after the warm-up period.

In the second embodiment of the present application, the receiver uses continuously-variable gain control. In this case, front end gain controller 720 provides a continuously variable gain control signal as shown in FIG. 8B. In FIG. 8B, when the receive mean power level or RSSI is low, front end gain controller 720 provides a high gain control state value so that LNA 312 is adjusted to a high gain. When the receive mean power level increases, front end gain controller 720 adjusts the gain state values so as to lower the gain G of LNA 312. The relation between the gain control state value and the receive mean power level may be nonlinear, and desirably is a monotonically non-increasing function such as that shown.

In the third embodiment of the present application, the receiver uses both step and continuously variable gain control. Front end gain controller 720 provides step and continuously variable gain control signals, and the signal lines 328, 329, and 331 of FIG. 7 are interpreted as multiple parallel lines or an array of signals. At least one signal line corresponds to step gain control and the other signal lines corresponds to continuous gain control. LNA 312 may be controlled by both types of control signals simultaneously. For example, one stage of LNA 312 receives a step gain control signal and another stage of it receives a continuous gain control signal.

Figure 9:
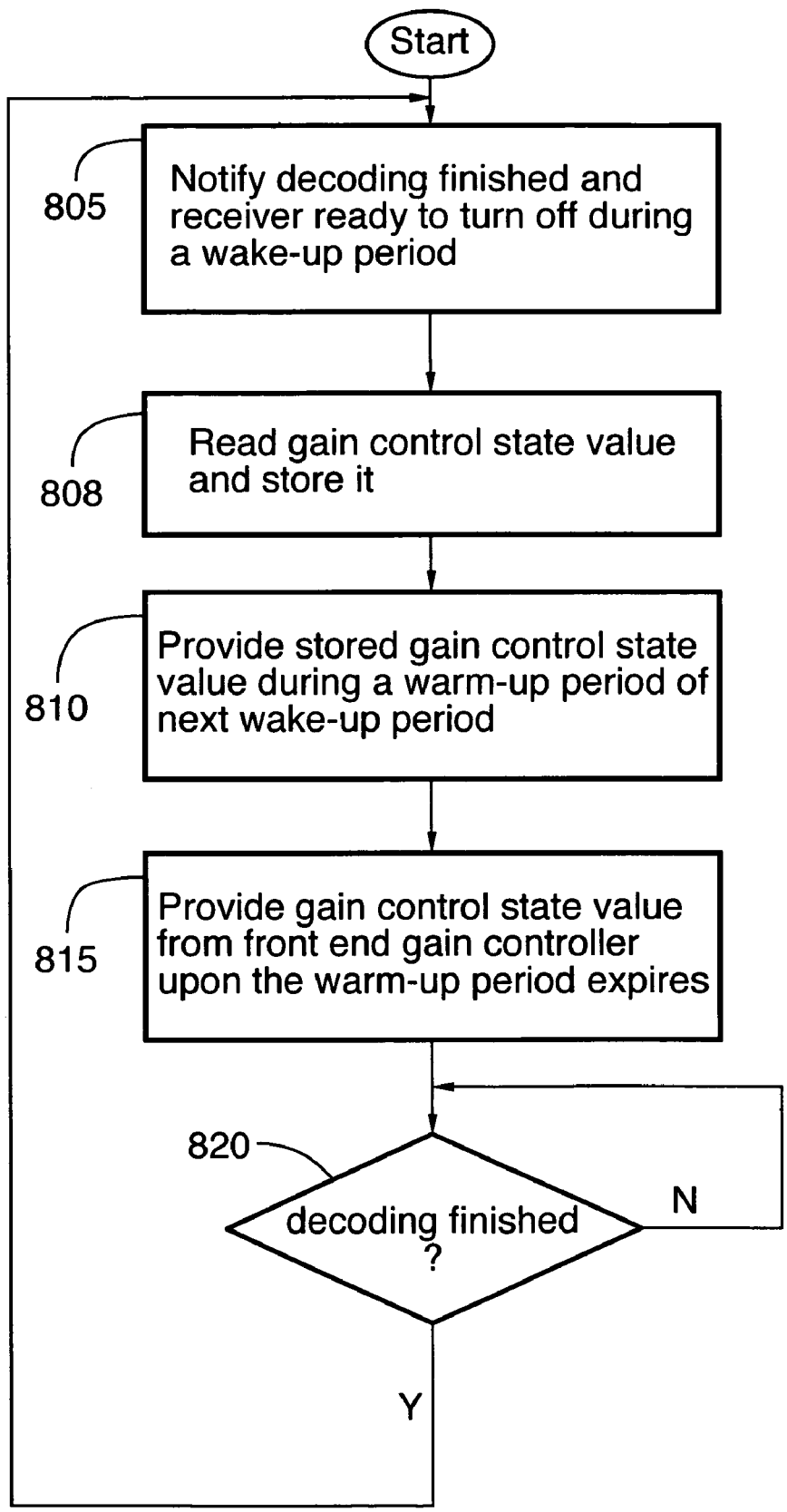
FIG. 9 shows a flowchart of a method for controlling the gain state of a wireless receiver operating in an idle mode.

FIG. 9 shows a flowchart of a method for controlling gain state of the wireless receiver operating in an idle mode according to the present application. At step 805 of FIG. 9, the decoder 725 of the mobile device provides a notification signal to notify the microprocessor 738 that the decoder has finished decoding the signal in a wake-up period. This signal indicates that the receiver is ready to be placed in a sleep mode, so microprocessor 738 can turn off power of the receiver 212 (e.g., at time instants D1, D2, etc. of FIG. 6B). At step 808, in response to the notification from decoder 725, the microprocessor 328 reads the gain state 328 and stores it in memory 740. It also sets timer 750 to a period from the end of a first wake-up period (such as instant D1 of FIG. 6B) to the beginning of a second wake-up period (such as instant A2 of FIG. 6B) for the next wake up time. Receiver 212 is placed in the sleep mode (e.g. receiver 212 is powered off).

At step 810, when timer 750 expires and informs microprocessor 738 of the start of the wake-up period (e.g. instants A1, A2, etc. of FIG. 6B), the microprocessor 738 turns on the receiver 212 and sets timer 750 to a period equal to the warm-up period (e.g. B1 or B2 of FIG. 6B) to start counting. The microprocessor 738 also sets the MUX 730 to select the port B to use gain state value 329 from memory. At step 815, timer 750 expires and notifies the microprocessor 738 of the end of the warm-up period (e.g. instants E1 and E2 of FIG. 6B). In response to this notification, the microprocessor 738 sets the MUX 730 through selection signal 330 to allow the path from front end gain controller 720 to LNA 312 via port A of MUX 730. Gain control state value 328 is provided to LNA 312 from front end gain controller 720, which operates based on a signal level of currently received signals. At step 820, the microprocessor 738 detects whether the decoder 725 notification of finishing decoding has arrived; if not it continues to detect, if so operation goes back to step 805.

Advantageously, the present application provides a method and apparatus for controlling a gain state of a wireless receiver to achieve faster settling time during wake-up periods in idle mode. One illustrative method includes the steps of receiving a notification signal which indicates that the wireless receiver is to be placed in a sleep mode, reading a gain control state value from a gain controller based on receiving the notification signal, storing the gain control state value in memory, providing the stored gain control state value from the memory to the wireless receiver during a warm-up period of a second wake-up period following the first wake-up period, and providing a gain control state value from the gain controller to the wireless receiver based on a received signal level of a currently received signal of the wireless receiver after the warm-up period.

An illustrative mobile station of the present application comprises a receiver which receives radio frequency (RF) signals through an antenna, an amplifier of the receiver which is adapted to amplify the RF signals, a level detector which is adapted to detect a signal level of the RF signals, a gain controller which is adapted to provide a gain control state value in response to the signal level, and a processor which is adapted to read a gain control state value from the gain controller during a first wake-up period of the receiver, store the gain control state value in memory, provide a selection signal for selecting the stored gain control state value from the memory to the receiver during a warm-up period of a second wake-up period following the first wake-up period, and provide a gain control state value from the gain controller to the receiver based on a signal level of a currently received signal in the receiver.

An illustrative circuit for a wireless receiver may comprise a low noise amplifier (LNA) which is adapted to amplify radio frequency (RF) signals in the wireless receiver; a level detector which is adapted to detect a signal level of the RF signals; a gain controller which is adapted to provide a gain control state value in response to the signal level; and a processor which is adapted to read a gain control state value from the gain controller during a first wake-up period of the wireless receiver, store the gain control state value in memory, provide a selection signal for selecting the stored gain control state value from the memory during a warm-up period of a second wake-up period following the first wake-up period, and provide after the warm-up period of the second wake-up period a gain control state value from the gain controller to the wireless receiver based on a signal level of a currently received signal in the wireless receiver.

The above-described embodiments of the present application are intended to be examples only. Those of skill in the art may effect alterations, modifications and variations to the particular embodiments without departing from the scope of the application. The invention described herein in the recited claims intends to cover and embrace all suitable changes in technology.

What is claimed is:

1. A method for controlling a gain state of a wireless receiver operating in an idle mode, the method comprising the steps of:
   receiving, during a first wake-up period of the wireless receiver, a notification signal which indicates that the wireless receiver is to be placed in a sleep mode;
   reading a gain control state value from a gain controller during the first wake-up period;
   storing the gain control state value in memory;
   in response to the notification signal:
      causing the wireless receiver to be placed in the sleep mode;
      running a sleep mode timer for the sleep mode;
   in response to expiration of the sleep mode timer:
      causing the wireless receiver to be exited from the sleep mode for entering into a second wake-up period;
      providing the stored gain control state value from the memory to the wireless receiver;
      running a warm-up period timer for a warm-up period of the second wake-up period;
   in response to expiration of the warm-up period timer:
      switching from use of the stored gained control state value by the wireless receiver to a gain control state value from the gain controller which is based on a signal level of a currently received signal in the wireless receiver.

2. The method of claim 1, comprising the further steps of:
   repeating the recited acts for subsequent sleep modes and wake-up periods of the wireless receiver.

3. The method of claim 1, further comprising:
   wherein the act of providing the stored gain control state value from the memory to the wireless receiver comprises providing it to a low noise amplifier (LNA) of the wireless receiver; and
   wherein the act of switching from use of the stored gained control state value in the wireless receiver to the gain control state value from the gain controller comprises providing the gain control state value from the gain controller to the LNA.

4. The method of claim 1, wherein the step of switching to the gain control state value from the gain controller comprises the further step of providing a step gain control state value from a plurality of gain control state values based on the signal level.

5. The method of claim 1, wherein the step of switching to the gain control state value from the gain controller comprises the further step of providing a continuously variable gain control state value based on the signal level.

6. The method of claim 1, wherein the step of switching to the gain control state value from the gain controller comprises the further step of providing a step gain control state value from a plurality of gain control state values and a continuously variable gain control state value based on the currently received signal.

7. The method of claim 4, wherein:
the step gain control state value is a constant high gain control state value while the signal level is less than a first predetermined threshold;
the step gain control state value is subject to hysteresis between a constant high gain control state value and a constant medium gain control state value while the signal level is between a first predetermined threshold and a second predetermined threshold;
the step gain control state value is a constant medium gain control state value while the signal level is between a second predetermined threshold and third predetermined threshold;
the step gain control state value is subject to hysteresis between a constant medium gain control state value and a constant low gain control state value while the signal level is between a third predetermined threshold and a fourth predetermined threshold; and
the step gain control state value is a constant low gain control state value while the signal level is greater than a fourth predetermined threshold.

8. The method of claim 4, wherein
the step gain control state value is a constant high gain control state value while the signal level is less than a first predetermined threshold;
the step gain control state value is subject to hysteresis between a constant high gain control state value and a constant low gain control state value while the signal level is between a first predetermined threshold and a second predetermined threshold; and
the step gain control signal provides a constant low gain control state value while the signal level is greater than a second predetermined threshold.

9. The method of claim 5, wherein the continuously variable gain control state value is monotonically non-increasing with respect to the signal level.

10. The method of claim 6, wherein:
the step gain control state value is a constant high gain control state value while the signal level is less than a first predetermined threshold;
the step gain control state value is subject to hysteresis between a constant high gain control state value and a constant medium gain control state value while the signal level is between a first predetermined threshold and a second predetermined threshold;
the step gain control state value is a constant medium gain control state value while the signal level is between a second predetermined threshold and third predetermined threshold;
the step gain control state value is subject to hysteresis between a constant medium gain control state value and a constant low gain control state value while the signal level is between a third predetermined threshold and a fourth predetermined threshold;
the step gain control state value is a constant low gain control state value while the signal level is greater than a fourth predetermined threshold; and
the continuously variable gain control state value is monotonically non-increasing with respect to the signal level.

11. The method of claim 6, wherein:
the step gain control state value is a constant high gain control state value while the signal level is less than a first predetermined threshold;
the step gain control state value is subject to hysteresis between a constant high gain control state value and a constant low gain control state value while the signal level is between a first predetermined threshold and a second predetermined threshold;
the step gain control signal provides a constant low gain control state value while the signal level is greater than a second predetermined threshold; and
the continuously variable gain control state value is monotonically non-increasing with respect to the signal level.

12. A mobile station, comprising:
a receiver adapted to receive radio frequency (RF) signals through an antenna;
an amplifier of the receiver which is adapted to amplify the RF signals;
a level detector adapted to detect a signal level of the RF signals;
a gain controller adapted to provide a gain control state value in response to the signal level; and
a processor adapted to:
  read a gain control state value from the gain controller during a first wake-up period of the receiver;
  store the gain control state value in memory;
  in response to receiving a notification signal which indicates that the receiver is to be placed in a sleep mode:
    cause the receiver to be placed in the sleep mode;
    run a sleep mode timer for the sleep mode;
  in response to expiration of the sleep mode timer:
    cause the receiver to be exited from the sleep mode for entering into a second wake-up period;
    provide a selection signal for selecting the stored gain control state value from the memory to the amplifier for a warm-up period of the second wake-up period;
    run a warm-up period timer for the warm-up period; and
  in response to expiration of the warm-up period timer:
    switch from use of the stored gained control state value by the amplifier to a gain control state value from the gain controller which is based on a signal level of a currently received signal in the receiver.

13. The mobile station of claim 12, further comprising:
a multiplexer adapted to provide the stored gain control state value from the memory to the amplifier during the warm-up period of the second wake-up period and provide the gain control state value from the gain controller to the amplifier after the warm-up period of the second wake-up period.

14. The mobile station of claim 12, further comprising:
a notification means adapted to indicate that the receiver is to be placed in the sleep mode; and
the processor being further adapted to read the gain control state value from the gain controller and store the gain control state value in the memory based on receiving the indication from the notification means.

15. The mobile station of claim 12, wherein the processor is further operative to:
continue to repeat the recited actions for subsequent sleep modes and wake-up periods of the receiver.

16. The mobile station of claim 12, wherein the amplifier comprises a low noise amplifier (LNA).

17. The mobile station of claim 12, wherein the gain controller is further adapted to provide a step gain control state value including a plurality of gain state values in response to the signal level.

18. The mobile station of claim 17, wherein:
the step gain control state value is a constant high gain control state value while the signal level is less than a first predetermined threshold;
the step gain control state value is subject to hysteresis between a constant high gain control state value and a constant medium gain control state value while the signal level is between a first predetermined threshold and a second predetermined threshold;
the step gain control state value is a constant medium gain control state value while the signal level is between a second predetermined threshold and third predetermined threshold;
the step gain control state value is subject to hysteresis between a constant medium gain control state value and a constant low gain control state value while the signal level is between a third predetermined threshold and a fourth predetermined threshold; and
the step gain control state value is a constant low gain control state value while the signal level is more than a fourth predetermined threshold.

19. The mobile station of claim 17, wherein:
the step gain control state value is a constant high gain control state value while the signal level is less than a first predetermined threshold;
the step gain control state value is subject to hysteresis between a constant high gain control state value and a constant low gain control state value while the signal level is between a first predetermined threshold and a second predetermined threshold; and
the step gain control signal provides a constant low gain control state value while the signal level is more than a second predetermined threshold.

20. The mobile station of claim 12, wherein the gain controller provides a continuously variable gain control state value in response to the signal level.

21. The mobile station of claim 20, wherein the continuously variable gain control state value is monotonically non-increasing with respect to the signal level.

22. The mobile station of claim 12, wherein the gain controller provides a step gain control state value from a plurality of gain control state values and a continuously variable gain control state value in response to the signal level.

23. The mobile station of claim 22, wherein:
the step gain control state value is a constant high gain control state value while the signal level is less than a first predetermined threshold;
the step gain control state value is subject to hysteresis between a constant high gain control state value and a constant medium gain control state value while the signal level is between a first predetermined threshold and a second predetermined threshold;
the step gain control state value is a constant medium gain control state value while the signal level is between a second predetermined threshold and third predetermined threshold;
the step gain control state value is subject to hysteresis between a constant medium gain control state value and a constant low gain control state value while the signal level is between a third predetermined threshold and a fourth predetermined threshold;
the step gain control state value is a constant low gain control state value while the signal level is more than a fourth predetermined threshold; and
the continuously variable gain control state value is monotonically non-increasing with respect to the signal level.

24. The mobile station of claim 22, wherein:
the step gain control state value is a constant high gain control state value while the signal level is less than a first predetermined threshold;
the step gain control state value is subject to hysteresis between a constant high gain control state value and a constant low gain control state value while the signal level is between a first predetermined threshold and a second predetermined threshold;
the step gain control signal provides a constant low gain control state value while the signal level is more than a second predetermined threshold; and
the continuously variable gain control state value is monotonically non-increasing with respect to the signal level.

25. A circuit for a wireless receiver, comprising:
a low noise amplifier (LNA) adapted to amplify radio frequency (RF) signals in the wireless receiver;
a level detector adapted to detect a signal level of the RF signals;
a gain controller adapted to provide a gain control state value in response to the signal level; and
a processor adapted to:
read a gain control state value from the gain controller during a first wake-up period of the wireless receiver;
store the gain control state value in memory;
in response to receiving a notification signal which indicates that the receiver is to be placed in a sleep mode:
cause the wireless receiver to be placed in the sleep mode;
run a sleep mode timer for the sleep mode;
in response to expiration of the sleep mode timer:
cause the wireless receiver to be exited from the sleep mode for entering into a second wake-up period;
provide a selection signal for selecting the stored gain control state value from the memory to the LNA for a warm-up period of the second wake-up period;
run a warm-up period timer for the warm-up period; and
in response to expiration of the warm-up period timer:
cause a switch from use of the stored gained control state value by the LNA to a gain control state value from the gain controller which is based on a signal level of a currently received signal in the wireless receiver.

* * * * *